United States Patent
Muraoka et al.

(10) Patent No.: US 8,018,760 B2
(45) Date of Patent: Sep. 13, 2011

(54) RESISTANCE VARIABLE ELEMENT AND RESISTANCE VARIABLE MEMORY APPARATUS

(75) Inventors: Shunsaku Muraoka, Osaka (JP); Koichi Osano, Osaka (JP); Satoru Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 297 days.

(21) Appl. No.: 12/518,400

(22) PCT Filed: Dec. 20, 2007

(86) PCT No.: PCT/JP2007/074556
§ 371 (c)(1),
(2), (4) Date: Jun. 9, 2009

(87) PCT Pub. No.: WO2008/081741
PCT Pub. Date: Jul. 10, 2008

(65) Prior Publication Data
US 2010/0008127 A1  Jan. 14, 2010

(30) Foreign Application Priority Data
Dec. 28, 2006 (JP) ................. 2006-354218

(51) Int. Cl.
*G11C 11/00* (2006.01)
(52) U.S. Cl. ......... 365/163; 365/113; 365/100; 365/148
(58) Field of Classification Search .................. 365/163, 365/100, 148
See application file for complete search history.

(56) References Cited

U.S. PATENT DOCUMENTS

| | | | |
|---|---|---|---|
| 6,204,139 B1 | 3/2001 | Liu et al. | |
| 7,446,391 B2 * | 11/2008 | Odagawa et al. | 257/536 |
| 2004/0114429 A1 | 6/2004 | Ehiro et al. | |
| 2006/0120205 A1 | 6/2006 | Odagawa et al. | |
| 2007/0196696 A1 | 8/2007 | Osano et al. | |

FOREIGN PATENT DOCUMENTS

| | | |
|---|---|---|
| JP | 2004-185756 | 7/2004 |
| JP | 2004-204348 | 7/2004 |
| JP | 2004-241396 | 8/2004 |
| JP | 2004-363604 | 12/2004 |
| JP | 2006-080259 | 3/2006 |
| WO | WO 2005/101420 A1 | 10/2005 |
| WO | WO 2006/028117 A1 | 3/2006 |

* cited by examiner

*Primary Examiner* — Jason Lappas
(74) *Attorney, Agent, or Firm* — McDermott Will & Emery LLP

(57) ABSTRACT

A resistance variable element of the present invention and a resistance variable memory apparatus using the resistance variable element are a resistance variable element (10) including a first electrode, a second electrode, and a resistance variable layer (3) provided between the first electrode (2) and the second electrode (4) to be electrically connected to the first electrode (2) and the second electrode (4), wherein the resistance variable layer (3) contains a material having a spinel structure represented by a chemical formula of $(Zn_xFe_{1-x})Fe_2O_4$, and the resistance variable element (10) has a feature that an electrical resistance between the first electrode (2) and the second electrode (4) increases by applying a first voltage pulse to between the first electrode (2) and the second electrode (4), and the electrical resistance between the first electrode (2) and the second electrode (4) decreases by applying a second voltage pulse whose polarity is the same as the first voltage pulse to between the first electrode (2) and the second electrode (4), and a resistance variable memory apparatus using the resistance variable element (10).

14 Claims, 8 Drawing Sheets

X=0.90

X=1

RESISTANCE VARIABLE ELEMENT AND RESISTANCE VARIABLE MEMORY APPARATUS

RELATED APPLICATIONS

This application is the U.S. National Phase under 35 U.S.C. §371 of International Application No. PCT/JP2007/074556, filed on Dec. 20, 2007, which in turn claims the benefit of Japanese Application No. 2006-354218, filed on Dec. 28, 2006, the disclosures of which Applications are incorporated by reference herein.

TECHNICAL FIELD

The present invention relates to a resistance variable element and a resistance variable memory apparatus, and more particularly to a resistance variable element whose electrical resistance changes depending on a voltage pulse applied thereto, and a resistance variable memory apparatus utilizing the resistance variable element.

BACKGROUND ART

As digital technologies of electronic devices progress, in order to save data, such as images, there are growing needs for an increase in capacity of a nonvolatile resistance variable element, a reduction in electric power required for writing to the nonvolatile resistance variable element, a reduction in time required for writing to and reading out from the nonvolatile resistance variable element, and an increase in life of the nonvolatile resistance variable element. It is said that although there are such needs, there is a limit to miniaturization of an existing flash memory using a floating gate.

As a first prior art which may be able to respond to the above needs, proposed is a nonvolatile resistance variable element using a perovskite material (such as $Pr_{(1-x)}Ca_xMnO_3$ [PCMO], $LaSrMnO_3$[LSMO], or $GdBaCo_xO_y$[GBCO]) (Patent Document 1). In accordance with this technology, the nonvolatile resistance variable element stores data corresponding to a resistance value of the nonvolatile resistance variable element which value increases or decreases by application of a predetermined voltage pulse (waveform voltage whose duration time is short) to the perovskite material.

One method for increasing the capacity of a memory array is to stack a plurality of memory arrays. To stack the memory arrays, it is desirable that the memory array be configured to have a cross-point structure. In the memory array having the cross-point structure, it is necessary to prevent cross talk (current leakage) between adjacent memory cells. To prevent the cross talk, it is effective to arrange a diode in series with a memory element in each memory cell. In the case of switching the resistance value by voltage pulses having different polarities from each other, current needs to flow in both directions, so that a bidirectional current limiting element (element, such as a varistor, whose resistance value becomes high when an absolute value of an applied voltage is less than a critical voltage and becomes extremely low when the absolute value of the applied voltage is the critical voltage or more) is required. However, the bidirectional current limiting element is complex in configuration, and even in the case of using the bidirectional current limiting element, designing, for example, the relation between the resistance value of the resistance variable element and the resistance value of the bidirectional current limiting element is difficult.

As a second prior art which realizes switching of the resistance value by the voltage pulses having the same polarity as each other, proposed is a nonvolatile resistance variable element utilizing a feature that the resistance value of a transition metal oxide (NiO, $V_2O$, ZnO, $Nb_2O_5$, $TiO_2$, $WO_3$, or CoO) layer changes by application of the voltage pulse to the transition metal oxide layer (see Patent Document 2). In the resistance variable element using the transition metal oxide layer, the configuration of stacking the cross-point type memory arrays using the diodes is realized.

As a third prior art, proposed is a resistance variable element configured such that a material having a perovskite structure is sandwiched between electrodes, and all write voltage pulses have the same polarity as one another (i.e., the resistance variable element is operated by unipolar drive) (Patent Documents 3 and 4).

As a fourth prior art, proposed is a resistance variable element configured such that a material layer having a spinel structure is sandwiched between electrodes, and the polarity of an electrical pulse for obtaining a high resistance and the polarity of an electrical pulse for obtaining a low resistance are different from each other (i.e., the resistance variable element carries out bipolar drive) (Patent Document 5).

Patent Document 1: U.S. Pat. No. 6,204,139
Patent Document 2: Japanese Laid-Open Patent Application Publication 2004-363604
Patent Document 3: Japanese Laid-Open Patent Application Publication 2004-204348
Patent Document 4: Japanese Laid-Open Patent Application Publication 2004-241396
Patent Document 5: Japanese Laid-Open Patent Application Publication 2006-080259

DISCLOSURE OF THE INVENTION

Problems to be Solved by the Invention

However, in the first prior art and the third prior art, operation stability and reproducibility are inadequate. Crystallization of oxide crystal having the perovskite structure, such as $(Pr_{0.7}Ca_{0.3}MnO_3)$, requires high temperature of normally 650° C. to 850° C. Therefore, if this crystallization is introduced to a semiconductor manufacturing process, other materials deteriorate.

To configure the cross-point type memory array, it is desirable that the writing can be carried out using the diode. To utilize the diode, it is desirable that the resistance variable element have a feature that all the write voltage pulses have the same polarity as one another (i.e., the resistance variable element can be operated by the unipolar drive). However, only several types of the resistance variable element having such feature are known, and development of new resistance variable elements having such feature has been desired.

An object of the present invention is to provide a new resistance variable element which can be manufactured at low temperature and has a feature that all the write voltage pulses have the same polarity as one another (i.e., resistance variable element can be operated by the unipolar drive), and a resistance variable memory apparatus using the resistance variable element.

Means for Solving the Problems

The present inventors have diligently studied a material used for a resistance variable layer of a resistance variable element. As a result, it was found that the unipolar drive can be carried out by using as a material of the resistance variable layer a material obtained by mixing Zn as an impurity in $Fe_3O_4$. It was also found that a manufacturing temperature is low (for example, 300° C. or lower) in the case of this configuration.

In the second prior art, forming that is an operation of applying a high voltage to the resistance variable layer after the layer is manufactured (after layer formation) needs to be carried out in order that the resistance variable layer may stably show a predetermined resistance value. If the forming is carried out for respective elements, it takes long time to manufacture the resistance variable memory apparatus having an extremely large number of elements for example. As a result of diligent study regarding whether the forming is necessary or not in the present invention, it was found that the forming becomes unnecessary by suitably adjusting a mixing ratio of Zn.

To be specific, a resistance variable element of the present invention includes: a first electrode; a second electrode; and a resistance variable layer provided between the first electrode and the second electrode to be electrically connected to the first electrode and the second electrode, wherein: the resistance variable layer contains a material having a spinel structure represented by a chemical formula of $(Zn_xFe_{1-x})Fe_2O_4$; and the resistance variable element has a feature that an electrical resistance between the first electrode and the second electrode decreases by applying a first voltage pulse having a first voltage to between the first electrode and the second electrode, and the electrical resistance between the first electrode and the second electrode increases by applying a second voltage pulse having a second voltage whose polarity is the same as the first voltage to between the first electrode and the second electrode.

With this configuration, it is possible to provide a new resistance variable element which can be manufactured at low temperature and has the feature that all the write voltage pulses have the same polarity as one another (i.e., the resistance variable element can be operated by the unipolar drive).

The resistance variable element may be for use in unipolar drive and store information by causing the electrical resistance between the first electrode and the second electrode to decrease by applying the first voltage pulse having the first voltage to between the first electrode and the second electrode, and by causing the electrical resistance between the first electrode and the second electrode to increase by applying the second voltage pulse having the second voltage whose polarity is the same as the first voltage to between the first electrode and the second electrode.

With this configuration, a storing operation by the unipolar drive can be realized by using the new resistance variable element which can be manufactured at low temperature and has the feature that all the write voltage pulses have the same polarity as one another (i.e., the resistance variable element can be operated by the unipolar drive).

In the resistance variable element, a pulse width of the first voltage pulse may be a first pulse width, a pulse width of the second voltage pulse may be a second pulse width, and the second pulse width may be longer than the first pulse width.

With this configuration, the writing for changing to the high resistance state can be surely carried out.

In the resistance variable element, the X may be not less than 0.65 and not more than 1.

With this configuration, it is possible to provide the new resistance variable element which can be manufactured at low temperature and surely has the feature that all the write voltage pulses have the same polarity as one another (i.e., the resistance variable element can be operated by the unipolar drive).

In the resistance variable element, the X may be not less than 0.65 and not more than 0.85.

With this configuration, forming becomes unnecessary when manufacturing the new resistance variable element which can be manufactured at low temperature and surely has the feature that all the write voltage pulses have the same polarity as one another (i.e., the resistance variable element can be operated by the unipolar drive).

The resistance variable element may further include a rectifying element electrically connected to the first electrode or the second electrode. In the resistance variable element, the rectifying element may be a diode.

With this configuration, since the resistance variable element includes the rectifying element or the diode, it is applicable to a cross-point memory.

In the resistance variable element, at least one of the first electrode and the second electrode may be an electrode made of one or a plurality of materials selected from the group consisting of Ag, Au, Pt, Ru, $RuO_2$, Ir, $IrO_2$, TiO, TiN, TlAlN, Ta, and TaN.

With this configuration, it is possible to provide the resistance variable element which can stably operate.

In the resistance variable element, the resistance variable layer may have a thickness of 200 nm or less.

With this configuration, processing becomes easy in the case of using lithography in a patterning process, and the voltage value of the voltage pulse for changing the resistance value of the resistance variable element can be lowered.

Moreover, a resistance variable memory apparatus of the present invention includes: the above resistance variable element; and a voltage pulse applying device, wherein the voltage pulse applying device is configured to apply a predetermined voltage pulse to between the first electrode and the second electrode to cause the resistance variable element to store data corresponding to the resistance value of the resistance variable element which value changes by the predetermined voltage pulse.

With this configuration, the data can be stored in the resistance variable element by control of the voltage pulse applying device.

In the resistance variable memory apparatus, the voltage pulse applying device may be configured to apply the first voltage pulse having the first voltage to between the first electrode and the second electrode to cause the resistance variable element to change to a low resistance state and apply the second voltage pulse having the second voltage whose polarity is the same as the first voltage to between the first electrode and the second electrode to cause the resistance variable element to change to a high resistance state, to cause the resistance variable element to store data corresponding to the resistance state of the resistance variable element.

With this configuration, binary data can be stored in the resistance variable element by the control of the voltage pulse applying device.

Moreover, a resistance variable memory apparatus of the present invention includes: a cross-point type memory array in which each of memory cells includes the above resistance variable element; a memory cell selector configured to select a specific memory cell of the memory array; and a voltage pulse applying device, wherein the voltage pulse applying device is configured to apply a predetermined voltage pulse to between the first electrode and the second electrode of the memory cell selected by the memory cell selector to cause the resistance variable element to store data corresponding to the resistance value of the resistance variable element which value changes by the predetermined voltage pulse.

With this configuration, the cross-point type memory array is realized, stacking the memory arrays becomes easy, and the degree of integration can be improved.

Moreover, a resistance variable memory apparatus of the present invention includes: a memory array including a semiconductor substrate, a plurality of first wires formed on the semiconductor substrate so as to be in parallel with one another, a plurality of second wires formed above the plurality of first wires so as to be in parallel with one another on a plane parallel to a main surface of the semiconductor substrate and three-dimensionally cross the plurality of first wires, and memory cells in each of which the above resistance variable element and a rectifying element are connected to each other in series, wherein the memory cell is provided to correspond to each of three-dimensional cross-points where the plurality of first wires and the plurality of second wires cross one another and to electrically connect to the first wire and the second wire; a first wire selector configured to select a specific first wire; a second wire selector configured to select a specific first wire; and a voltage pulse applying device, wherein the voltage pulse applying device is configured to apply the first voltage pulse having the first voltage to between the first electrode and the second electrode of the memory cell connected to the first wire selected by the first wire selector and the second wire selected by the second wire selector to cause the resistance variable element to change to a low resistance state and apply the second voltage pulse having the second voltage whose polarity is the same as the first voltage to between the first electrode and the second electrode of the memory cell connected to the first wire selected by the first wire selector and the second wire selected by the second wire selector to cause the resistance variable element to change to a high resistance state, to cause the resistance variable element to store data corresponding to the resistance state of the resistance variable element.

With this configuration, a binary data storing cross-point type memory array is realized, stacking the memory arrays becomes easy, and the degree of integration can be improved.

Moreover, a method for recording data to a resistance variable element of the present invention includes the steps of: applying two types of voltage pulses having the same polarity as each other to between the first electrode and the second electrode of the resistance variable element according to claim 1 to change a resistance state of the resistance variable element; and recording data in the resistance variable element based on changes in the resistance state.

With this configuration, data recording by the unipolar drive using a predetermined resistance variable element can be carried out.

The above object, other objects, features and advantages of the present invention will be made clear by the following detailed explanation of preferred embodiments with reference to the attached drawings.

Effects of the Invention

The present invention has the above configuration and the following effects. To be specific, the present invention can provide a new resistance variable element which can be manufactured at low temperature and has a feature that all the write voltage pulses have the same polarity as one another (i.e., the resistance variable element can be operated by unipolar drive), and a resistance variable memory apparatus using the resistance variable element.

BRIEF DESCRIPTION OF THE DRAWINGS

FIG. 13 is a diagram showing changes in resistance value when the voltage pulses are applied to the resistance variable element of Comparative Example 1.

Figure 1:
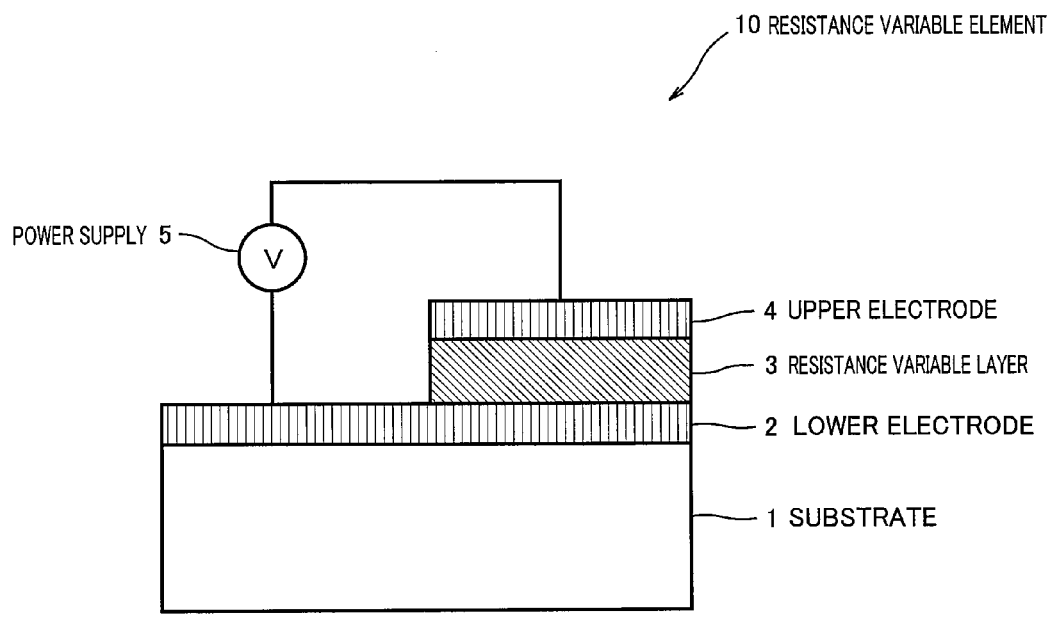
FIG. 1 is a schematic diagram showing one example of the configuration of a resistance variable element of Embodiment 1 of the present invention.

EXPLANATION OF REFERENCE NUMBERS 1 substrate
2 lower electrode
3 resistance variable layer
4 upper electrode
5 electrode
6 resistance variable element
7 rectifying element
10 resistance variable element
11 first terminal
12 second terminal
100 resistance variable memory apparatus
101 memory array
102 address buffer
103 controller
104 row decoder 105 word line driver
106 column decoder
107 bit line driver
W1, W2, W3 word line
B1, B2, B3 bit line
MC11, MC12, MC13, MC21, MC22, MC23, MC31, MC32, MC33 memory cell

BEST MODE FOR CARRYING OUT THE INVENTION

Hereinafter, preferred embodiments of the present invention will be explained in reference to the drawings.

Embodiment 1

Configuration

FIG. 1 is a schematic diagram showing one example of the configuration of a resistance variable element of Embodiment 1 of the present invention.

As shown in FIG. 1, a resistance variable element 10 of the present embodiment includes a substrate 1, a lower electrode 2 (first electrode) formed on the substrate 1, a resistance variable layer 3 formed on the lower electrode 2, and an upper electrode 4 (second electrode) formed on the resistance variable layer 3. The lower electrode 2 and the upper electrode 4 are electrically connected to the resistance variable layer 3. Note that the upper electrode 4 may be the first electrode, and the lower electrode 2 may be the second electrode.

The substrate 1 is constituted by a silicon substrate for example.

Each of the lower electrode 2 and the upper electrode 4 can be constituted by, for example, using one or a plurality of materials selected from the group consisting of Ag (silver), Au (gold), Pt (platinum), Ru (ruthenium), $RuO_2$ (ruthenium oxide), Ir (iridium), $IrO_2$ (iridium oxide), TiO (titanium dioxide), TiN (titanium nitride), TiAlN (titanium aluminum nitride), Ta (tantalum), and TaN (tantalum nitride). These materials are stable even at about 300° C., so that they are suitable for below-described conditions at the time of formation of the resistance variable layer 3.

The resistance variable layer 3 is made of a material having a spinel structure represented by a chemical formula of $(Zn_xFe_{1-x})Fe_2O_4$. To be specific, the material of the resistance variable layer 3 contains $Fe_3O_4$ (triiron tetroxide) as a major component and Zn (zinc) as an impurity.

It is preferable that X (a ratio of Zn as the impurity) be 0.65 or more. For example, an upper limit of a numerical range of X may be 1 or less ($X \leq 1$) or may be less than 1 ($X<1$). It is more preferable that X be not less than 0.65 and not more than 0.85. In this configuration ($0.65 \leq X \leq 0.85$), the forming becomes unnecessary.

It is preferable that the resistance variable layer 3 have a thickness of 1 μm or less. With this configuration, it is quite possible to change the resistance value of the resistance variable element by the application of the voltage pulse.

It is further preferable that the resistance variable layer 3 have a thickness of 200 nm or less. With this configuration, processing becomes easy in the case of using lithography in a patterning process, and the voltage value of the voltage pulse for changing the resistance value of the resistance variable element can be lowered.

It is preferable that the resistance variable layer 3 have a thickness of at least 10 nm. With this configuration, it is possible to more surely avoid breakdown (dielectric breakdown) at the time of voltage application.

To lower the voltage value of the voltage pulse for changing the resistance value of the resistance variable element, it is preferable that the resistance variable layer 3 be thinner.

Manufacturing Method

First, the lower electrode 2 (having a thickness of 0.2 μm for example) is formed on the substrate 1 by sputtering or the like. A target of $ZnFe_2O_4$ and a target of $Fe_3O_4$ are prepared, and the targets are caused to electrically discharge at the same time by sputtering. Thus, the resistance variable layer 3 having the spinel structure represented by the chemical formula of $(Zn_xFe_{1-x})Fe_2O_4$ is formed on the lower electrode 2. Further, the upper electrode 4 (having a thickness of 0.2 μm for example) is formed on the resistance variable layer 3 by sputtering or the like. Thus, the resistance variable element 10 is obtained.

The size and shape of each of the lower electrode 2, the upper electrode 4, and the resistance variable layer 3 are adjustable by masking and lithography.

The value of X of the resistance variable layer 3 can be easily adjusted by adjusting the voltage applied to each target. The temperature of the substrate may be 300° C.

Operations

As shown in FIG. 1, when using the resistance variable element 10, the lower electrode 2 and the upper electrode 4 are electrically connected to different terminals, respectively, of a power supply 5 (voltage pulse applying device). The power supply 5 is a power supply for driving the resistance variable element 10. The power supply 5 is configured to be able to apply an electrical pulse (voltage pulse) of a predetermined voltage and a predetermined duration to between the lower electrode 2 and the upper electrode 4. Hereinafter, the voltage of the voltage pulse is specified by the potential of the upper electrode 4 with respect to the potential of the lower electrode 2.

When the electrical pulse is applied to the resistance variable layer 3 by the power supply 5, the resistance value (electrical resistance) of the resistance variable layer 3 increases or decreases. Hereinafter, when the resistance value of the resistance variable layer 3 is a predetermined high value, a resistance state of the resistance variable element 10 is referred to as a high resistance state, and when the resistance value of the resistance variable layer 3 is a predetermined value lower than the high resistance state, the resistance state of the resistance variable element 10 is referred to as a low resistance state.

For example, when the voltage pulse (first voltage pulse, short pulse) of a first voltage and a first pulse width is applied to the resistance variable element 10 of the high resistance state, the resistance variable element 10 changes to the low resistance state. Even when the short pulse having the same polarity as the first voltage pulse is applied to the resistance variable element 10 of the low resistance state, the resistance variable element 10 does not change and remains in the low resistance state.

In contrast, when the voltage pulse (second voltage pulse, long pulse) of a second voltage lower than the first voltage and a second pulse width longer than the first pulse width is applied to the resistance variable element 10 of the low resistance state, the resistance variable element 10 changes to the high resistance state. Even when the long pulse having the same polarity as the second voltage pulse is applied to the resistance variable element 10 of the high resistance state, the resistance variable element 10 does not change and remains in the high resistance state.

In the present embodiment, the long pulse can have the same voltage polarity as the short pulse (for example, both are positive voltage pulses). To be specific, the resistance variable element of the present embodiment can be operated by unipolar drive. In the resistance variable element 10 of the present embodiment, for example, the first voltage is +3 V, the first pulse width is 100 ns, the second voltage is +2 V, and the second pulse width is 1 ms.

In the present embodiment, the high resistance state corresponds to "0", the low resistance state corresponds to "1", and an initial state of the resistance variable element 10 is the high resistance state ("0"). It is arbitrarily determined that which resistance state is assigned to which value, and which resistance state is assigned to the initial state.

Figure 2:
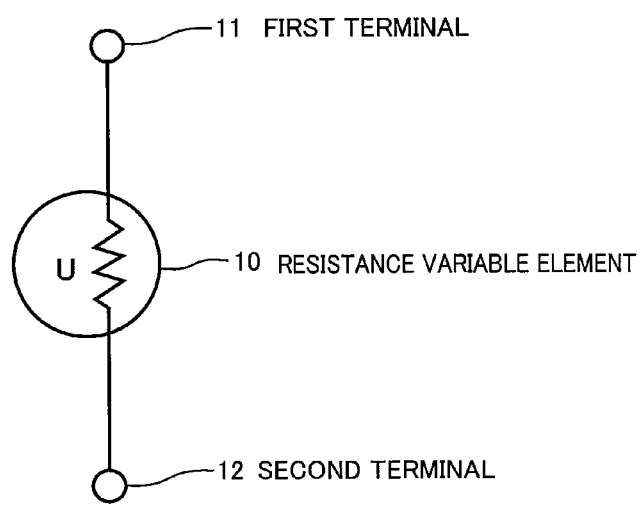
FIG. 2 is a diagram showing one example of a circuit configured to cause the resistance variable element of Embodiment 1 of the present invention to operate.

FIG. 2 is a diagram showing one example of a circuit configured to cause the resistance variable element of Embodiment 1 of the present invention to operate. Herein, the resistance variable element 10 is used as a memory, and carries out processing (writing and reading) of one-bit data. The circuit of FIG. 2 includes the resistance variable element 10, a first terminal 11, and a second terminal 12. The upper electrode 4 of the resistance variable element 10 is electrically connected to the first terminal 11, and the lower electrode 2 of the resistance variable element 10 is electrically connected to the second terminal 12.

Figure 3:
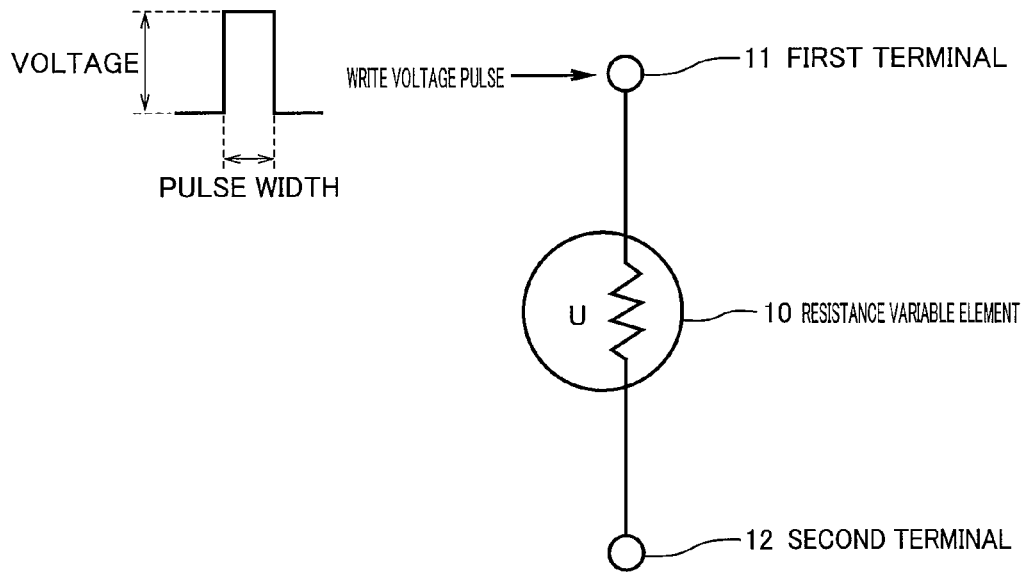
FIG. 3 is a diagram showing an operation carried out when writing data to the resistance variable element of Embodiment 1 of the present invention.
Figure 4:
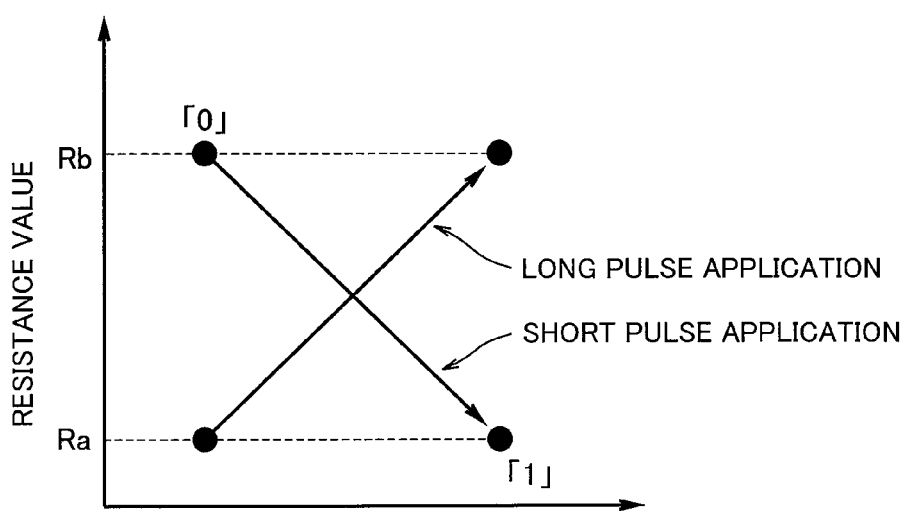
FIG. 4 is a diagram showing changes in resistance value when writing data to the resistance variable element of Embodiment 1 of the present invention.

FIG. 3 is a diagram showing an operation carried out when writing data to the resistance variable element of Embodiment 1 of the present invention. FIG. 4 is a diagram showing changes in resistance value when writing data to the resistance variable element of Embodiment 1 of the present invention. As shown in FIG. 3, at the time of the writing, the second terminal 12 is connected to ground (GND), and the voltage pulse is applied to the first terminal 11. The voltage pulse is specified based on the lower electrode 2 and a ground point.

When the short pulse is applied to the first terminal 11, the resistance value of the resistance variable element 10 decreases from Rb of the high resistance state to Ra of the low resistance state as shown in FIG. 4. In contrast, when the long pulse is applied to the first terminal 11, the resistance value of the resistance variable element 10 increases from Ra of the low resistance state to Rb of the high resistance state as shown in FIG. 4.

When writing (recording) one-bit data representing "1" to the resistance variable element 10, the resistance variable element 10 changes to the low resistance state (including a case where the resistance variable element 10 is originally in the low resistance state and remains in the low resistance state). This operation is referred to as "writing for changing to the low resistance state". In the writing for changing to the low resistance state, the second terminal 12 of FIG. 3 is connected to ground, and a write short pulse is applied to the first terminal 11. In accordance with this operation, the short pulse is applied to the resistance variable element 10, and the resistance value of the resistance variable element 10 becomes Ra of the low resistance state. To be specific, the resistance value of the resistance variable element 10 changes to Ra when it is Rb before the application of the voltage pulse, and the resistance value of the resistance variable element 10 does not change and remains Ra when it is Ra before the application of the voltage pulse. By the above method, the writing for changing to the low resistance state is carried out with respect to the resistance variable element 10.

When writing (recording) one-bit data representing "0" to the resistance variable element 10, the resistance variable element 10 changes to the high resistance state (including a case where the resistance variable element 10 is originally in the high resistance state and remains in the high resistance state). This operation is referred to as "writing for changing to the high resistance state". In the writing for changing to the high resistance state, the second terminal 12 of FIG. 3 is connected to ground, and a write long pulse is applied to the first terminal 11. In accordance with this operation, the long pulse is applied to the resistance variable element 10, and the resistance value of the resistance variable element 10 becomes Rb of the high resistance state. To be specific, the resistance value of the resistance variable element 10 remains Rb when it is Rb before the application of the voltage pulse, and the resistance value of the resistance variable element 10 changes to Rb when it is Ra before the application of the voltage pulse. By the above method, the writing for changing to the high resistance state is carried out with respect to the resistance variable element 10.

Figure 5:
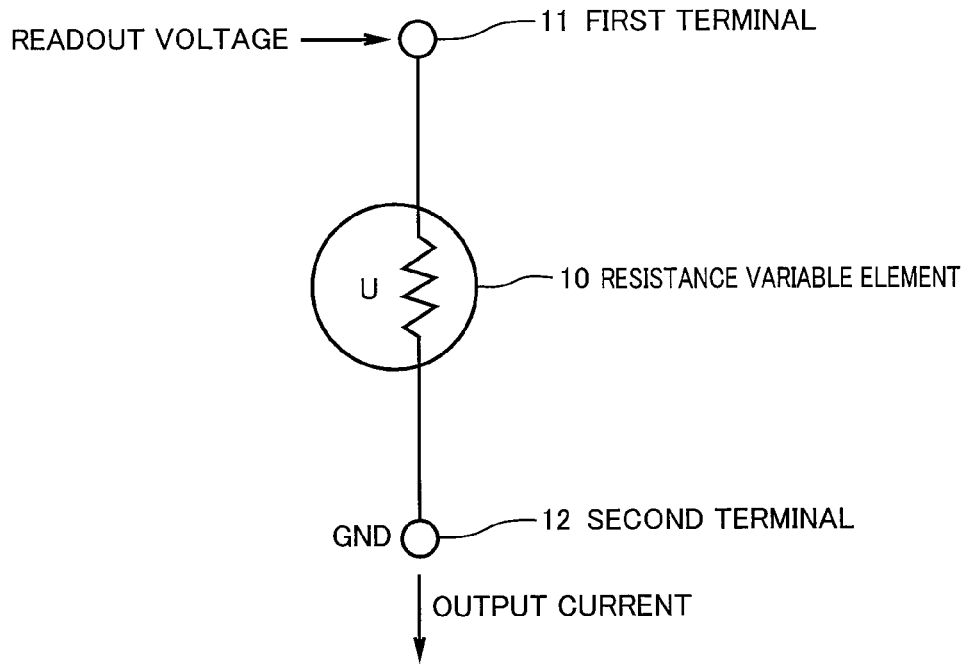
FIG. 5 is a diagram showing an operation carried out when reading out the data written to the resistance variable element of Embodiment 1 of the present invention.
Figure 6:
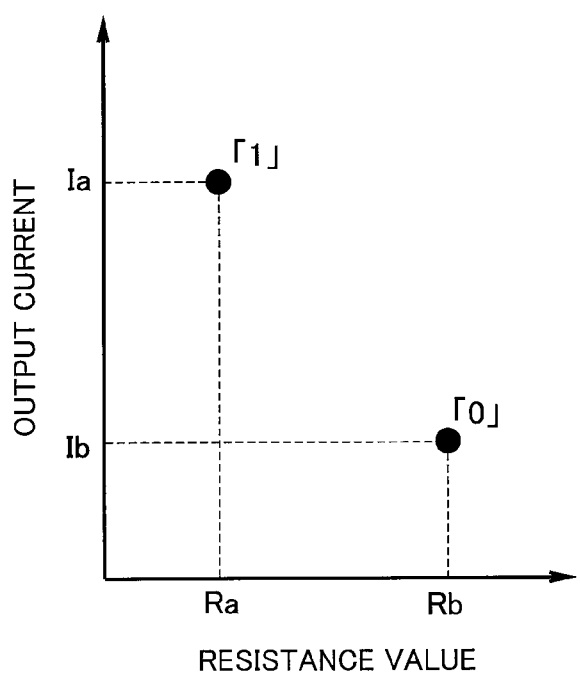
FIG. 6 is a diagram showing a relation between current flowing through the circuit at the time of reading and the resistance value of the resistance variable element, in the resistance variable element of Embodiment 1 of the present invention.

FIG. 5 is a diagram showing an operation carried out when reading out the data written to the resistance variable element of Embodiment 1 of the present invention. FIG. 6 is a diagram showing a relation between current flowing through the circuit at the time of reading and the resistance value of the resistance variable element, in the resistance variable element of Embodiment 1 of the present invention. As shown in FIG. 5, at the time of the writing, the second terminal 12 is connected to ground (GND), and a readout voltage is applied to the first terminal 11. The readout voltage is specified based on the lower electrode 2 and the ground point.

When the readout voltage is applied to the first terminal 11, the current corresponding to the resistance value of the resistance variable element 10 flows through the circuit. To be specific, as shown in FIG. 6, an output current value is Ia when the resistance value of the resistance variable element 10 is Ra of the low resistance state, and the output current value is Ib when the resistance value of the resistance variable element 10 is Rb of the high resistance state.

When reading out the resistance state of the resistance variable element 10, the second terminal 12 of FIG. 5 is connected to ground, and the readout voltage is applied to the first terminal 11. The readout voltage is set to +0.5 V for example. When the readout voltage is applied to the resistance variable element 10, the magnitude of the current flowing through the circuit becomes a current value corresponding to the resistance value of the resistance variable element. The resistance value of the resistance variable element 10 is obtained by detecting the value of the current flowing between the first terminal 11 and the second terminal 12. To be specific, when the current value is Ia, the resistance value of the resistance variable element 10 is Ra of the low resistance state, so that the data written to the resistance variable element 10 is determined as "1". When the current value is Ib, the resistance value of the resistance variable element 10 is Rb of the high resistance state, so that the data written to the resistance variable element 10 is determined as "0". By the above method, the data written to the resistance variable element 10 is read out.

The resistance variable element 10 of the present embodiment is nonvolatile, i.e., the resistance value of the resistance variable element 10 of the present embodiment does not change even if the power supply is turned off.

Effects

The resistance variable element of the present embodiment has a feature that all the write voltage pulses have the same polarity as one another (i.e., the resistance variable element can be operated by the unipolar drive). Since the resistance variable element of the present embodiment can be operated by the unipolar drive, it is possible to configure a cross-point type memory array using a unidirectional diode. The cross-point type memory arrays can be easily stacked, so that the degree of integration can be improved.

Since the resistance variable element of the present embodiment can be manufactured at low temperature of about 300° C., it is highly compatible with the conventional semiconductor manufacturing process (400° C. to 500° C.).

In accordance with the resistance variable element of the present embodiment, the forming becomes unnecessary by appropriately adjusting the amount of Zn.

In the resistance variable element of the present embodiment, the resistance variable layer has not an amorphous structure but a polycrystalline structure. Therefore, the resistance variable element of the present embodiment can maintain higher reliability as a memory than the conventional resistance variable element even if it is used for a long time (endurance is long).

Modification Example

Values of the first voltage, the first pulse width, the second voltage, the second pulse width, and the readout voltage are not limited to the above values. Those values may be any value as long as they are suitable for the resistance variable element to be actually manufactured.

An additional layer may be sandwiched between the lower electrode 2 and the resistance variable layer 3, and between the resistance variable layer 3 and the upper electrode 4, as long as the lower electrode 2 and the resistance variable layer 3 are electrically connected to each other, and the resistance variable layer 3 and the upper electrode 4 are electrically connected to each other.

The foregoing has explained an example in which the target of $ZnFe_2O_4$ and the target of $Fe_3O_4$ are caused to electrically discharge at the same time, sputtering is carried out, and the supplied electric power of each target at the time of the sputtering is adjusted, thereby changing the value of X in the chemical formula of $(Zn_xFe_{1-x})Fe_2O_4$. However, the method for adjusting the component of the resistance variable layer is not limited to this. For example, by carrying out the sputtering using the target obtained by mixing $ZnFe_2O_4$ and $Fe_3O_4$ in a predetermined ratio, it is possible to change the value of X in the chemical formula of $(Zn_xFe_{1-x})Fe_2O_4$.

EXAMPLES

Example 1

A lower electrode (20 μm×20 μm) made of Pt was formed on a silicon substrate by sputtering so as to have a thickness of 0.2 μm. A target of $ZnFe_2O_4$ and a target of $Fe_3O_4$ were prepared, and those targets were caused to electrically discharge at the same time by sputtering. Using masking and lithography, a resistance variable layer (10 μm ×10 μm, 100 μm$^2$) having the spinel structure represented by the chemical formula of $(Zn_xFe_{1-x})Fe_2O_4$ was formed on the lower electrode. The temperature of the substrate when forming the resistance variable layer was 300° C. The size of a contact portion where the lower electrode and the resistance variable layer contact each other was 2 μm×2 μm (4 μm$^2$). The thickness of the resistance variable layer was 100 nm. Further, an upper electrode (2 μm×2 μm) made of Pt was formed on the resistance variable layer by sputtering using masking and lithography so as to have a thickness of 0.2 μm. Thus, the resistance variable element was obtained. A contact portion where the upper electrode and the resistance variable layer contact each other was 2 μm×2 μm (4 μm$^2$).

In Example 1, the voltage applied to each target was adjusted such that the value of X of $(Zn_xFe_{1-x})Fe_2O_4$ constituting the resistance variable layer became 0.65. The value of X was verified by combination of RBS (Rutherford backscattering) and fluorescent X-ray analysis. As a result of this verification, the value of X was 0.65.

The resistance variable element obtained by the above method was connected to a power supply, and a short pulse (having a voltage of +3 V and a pulse width of 100 ns) and a long pulse (having a voltage of +2 V and a pulse width of 1 ms) were alternately applied to the resistance variable element. Here, a voltage in which the potential of the upper electrode is higher than the potential of the lower electrode was regarded as a positive voltage.

Each time the voltage pulse was applied, the resistance value of the resistance variable element was measured. When measuring the resistance value, a voltage of +0.5 V was applied for about seconds. The resistance value of the resistance variable element did not change by such voltage. The resistance value of the resistance variable element was calculated from the applied voltage (+0.5 V) and flowing current.

It was confirmed that the resistance variable element of Example 1 was nonvolatile, i.e., the resistance value of the resistance variable element of Example 1 did not change even if the power supply was turned off.

Figure 7:
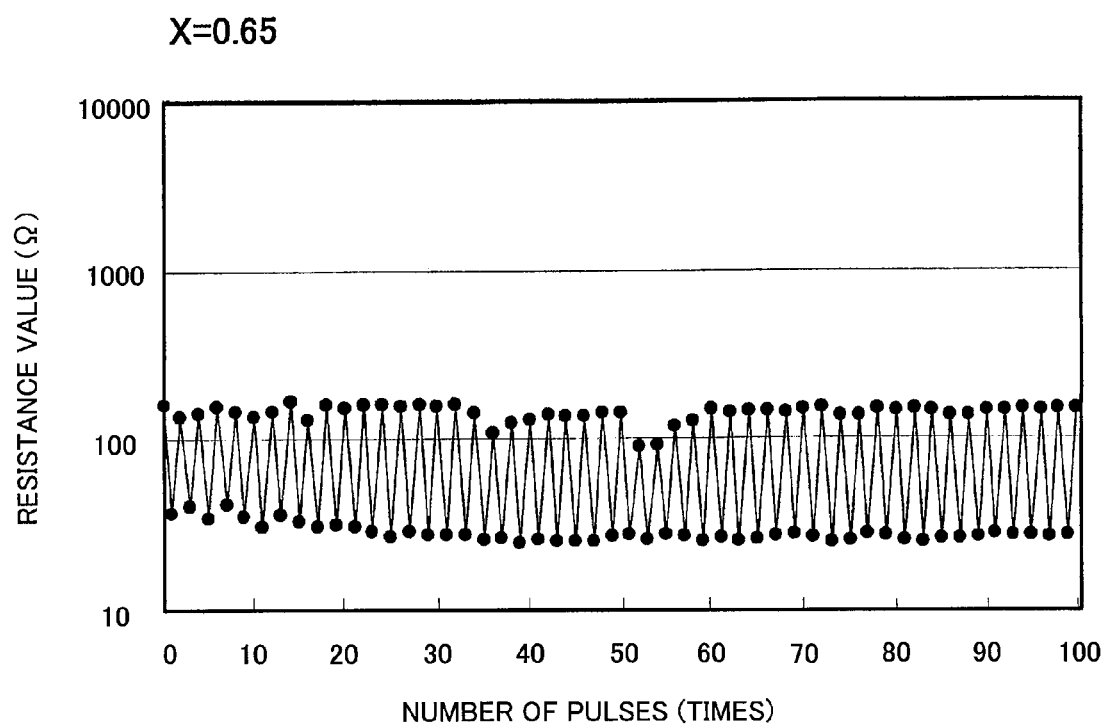
FIG. 7 is a diagram showing changes in resistance value when voltage pulses are applied to the resistance variable element of Example 1.

FIG. 7 is a diagram showing changes in resistance value when voltage pulses are applied to the resistance variable element of Example 1. As shown in FIG. 7, the resistance state changed from the high resistance state (about 160Ω) to the low resistance state (about 40Ω) by the first pulse application (short pulse application). The resistance state returned from the low resistance state to the high resistance state by the second pulse application (long pulse application). After that, by the application of two types of voltage pulses (the short pulse and the long pulse), the resistance value stably, periodically changed between the low resistance state and the high resistance state. To be specific, the resistance variable element of Example 1 showed a satisfactory memory property even at the time of the first pulse application. Therefore, it was found that the resistance variable element of Example 1 does not require the forming, and the resistance variable element obtained by forming respective layers can be used as a memory without a further process.

Even though the short pulse was applied to the resistance variable element of Example 1 when the resistance variable element was in the low resistance state, the resistance value of the resistance variable element did not practically change, and the resistance variable element remained in the low resistance state. Moreover, even though the long pulse was applied to the resistance variable element of Example 1 when the resistance variable element was in the high resistance state, the resistance value of the resistance variable element did not practically change, and the resistance variable element remained in the high resistance state. It was found from the above result that the resistance variable element of Example 1 was overwriteable.

Example 2

In Example 2, the resistance variable element was formed by the same method as Example 1 except that a parameter was different. Using this resistance variable element, the writing and the reading were carried out.

To be specific, in Example 2, the voltage applied to each target was adjusted such that the value of X of $(Zn_xFe_{1-x})Fe_2O_4$ constituting the resistance variable layer became 0.75. The value of X was verified by the combination of RBS (Rutherford backscattering) and fluorescent X-ray analysis. As a result of this verification, the value of X was 0.75.

It was confirmed that the resistance variable element of Example 2 was nonvolatile, i.e., the resistance value of the resistance variable element of Example 2 did not change even if the power supply was turned off.

Figure 8:
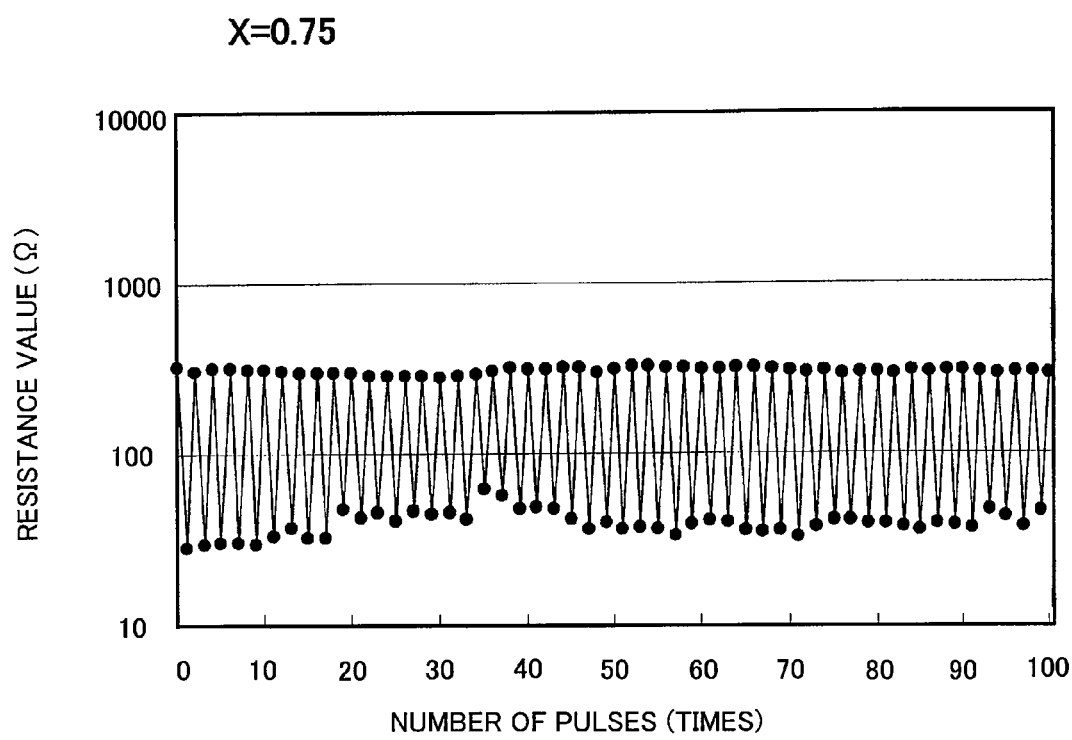
FIG. 8 is a diagram showing changes in resistance value when the voltage pulses are applied to the resistance variable element of Example 2.

FIG. 8 is a diagram showing changes in resistance value when the voltage pulses are applied to the resistance variable element of Example 2. As shown in FIG. 8, the resistance state changed from the high resistance state (about 320Ω) to the low resistance state (about 30Ω) by the first pulse application (short pulse application). The resistance state returned from the low resistance state to the high resistance state by the second pulse application (long pulse application). After that, by the application of two types of voltage pulses (the short pulse and the long pulse), the resistance value stably, periodically changed between the low resistance state and the high resistance state. To be specific, the resistance variable element of Example 2 showed a satisfactory memory property even at the time of the first pulse application. Therefore, it was found that the resistance variable element of Example 2 does not require the forming, and the resistance variable element obtained by forming respective layers can be used as a memory without a further process.

Even through the short pulse was applied to the resistance variable element of Example 2 when the resistance variable element was in the low resistance state, the resistance value of the resistance variable element did not practically change, and the resistance variable element remained in the low resistance state. Moreover, even though the long pulse was applied to the resistance variable element of Example 2 when the resistance variable element was in the high resistance state, the resistance value of the resistance variable element did not practically change, and the resistance variable element remained in the high resistance state. It was found from the above result that the resistance variable element of Example 2 was overwriteable.

Example 3

In Example 3, the resistance variable element was formed by the same method as Example 1 except that the parameter was different. Using this resistance variable element, the writing and the reading were carried out.

To be specific, in Example 3, the voltage applied to each target was adjusted such that the value of X of $(Zn_xFe_{1-x})Fe_2O_4$ constituting the resistance variable layer became 0.85. The value of X was verified by the combination of RBS (Rutherford backscattering) and fluorescent X-ray analysis. As a result of this verification, the value of X was 0.85.

It was confirmed that the resistance variable element of Example 3 was nonvolatile, i.e., the resistance value of the resistance variable element of Example 3 did not change even if the power supply was turned off.

Figure 9:
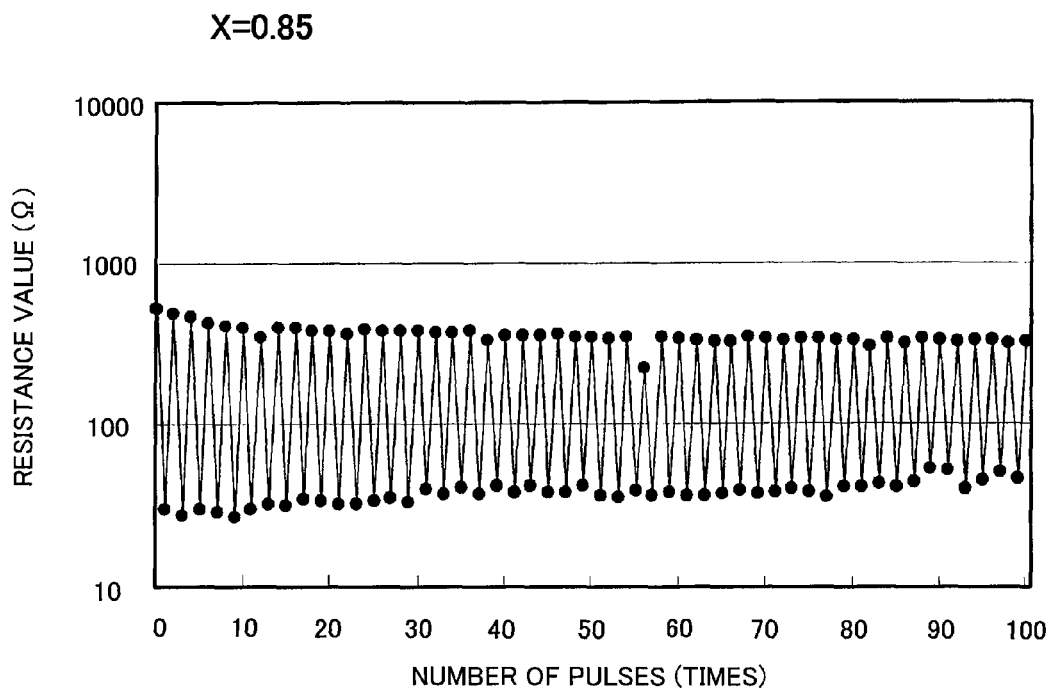
FIG. 9 is a diagram showing changes in resistance value when the voltage pulses are applied to the resistance variable element of Example 3.

FIG. 9 is a diagram showing changes in resistance value when the voltage pulses are applied to the resistance variable element of Example 3. As shown in FIG. 9, the resistance state changed from the high resistance state (about 500Ω) to the low resistance state (about 30Ω) by the first pulse application (short pulse application). The resistance state returned from the low resistance state to the high resistance state by the second pulse application (long pulse application). After that, by the application of two types of voltage pulses (the short pulse and the long pulse), the resistance value stably, periodically changed between the low resistance state and the high resistance state. To be specific, the resistance variable element of Example 3 showed a satisfactory memory property even at the time of the first pulse application. Therefore, it was found that the resistance variable element of Example 3 does not require the forming, and the resistance variable element obtained by forming respective layers can be used as a memory without a further process.

Even though the short pulse was applied to the resistance variable element of Example 3 when the resistance variable element was in the low resistance state, the resistance value of the resistance variable element did not practically change, and the resistance variable element remained in the low resistance state. Moreover, even though the long pulse was applied to the resistance variable element of Example 3 when the resistance variable element was in the high resistance state, the resistance value of the resistance variable element did not practically change, and the resistance variable element remained in the high resistance state. It was found from the above result that the resistance variable element of Example 3 was overwriteable.

Example 4

In Example 4, an endurance property (operation stability) was verified using the resistance variable element of Example 3 in which the value of X was 0.85.

Figure 10:
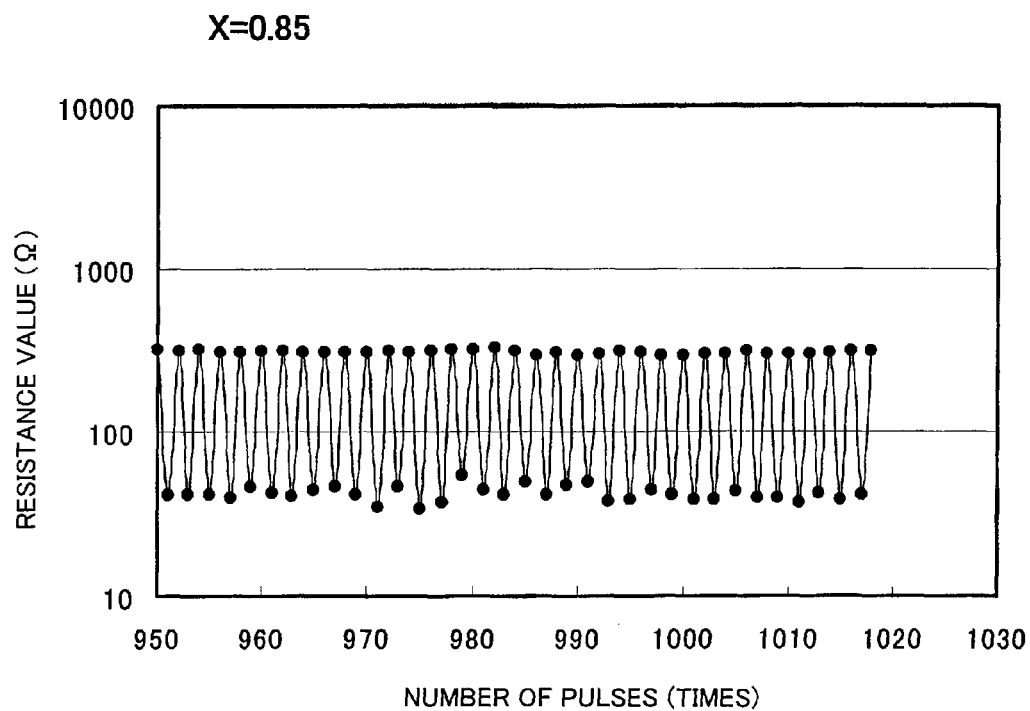
FIG. 10 is a diagram showing changes in resistance value when a write operation (voltage pulse of +3 V, 100 ns) for changing to a low resistance state and a write operation (voltage pulse of +2 V, 1 ms) for changing to a high resistance state are repeatedly carried out for about 1,000 times with respect to the resistance variable element obtained in Example 3.

FIG. 10 is a diagram showing changes in resistance value when a write operation (voltage of +3 V, pulse width of 100 ns) for changing to the low resistance state and a write operation (voltage of +2 V, pulse width of 1 ms) for changing to the high resistance state are repeatedly carried out for about 1,000 times with respect to the resistance variable element obtained in Example 3. As shown in FIG. 10, it was found that even if the writing is repeated for 1,000 times or more, the resistance value of the resistance variable element stably, periodically changes between the low resistance state and the high resistance state. Moreover, it was found that the resistance value in the low resistance state and the resistance value in the high resistance state change little from the beginning (FIG. 9) till the end (FIG. 10) of the experiment. Therefore, it was found that the resistance variable element of Example 3 shows a satisfactory endurance property.

Example 5

In Example 5, the resistance variable element was formed by the same method as Example 1 except that the parameter was different, and the forming was carried out. Using this resistance variable element, the writing and the reading were carried out.

To be specific, in Example 5, the voltage applied to each target was adjusted such that the value of X of $(Zn_xFe_{1-x})Fe_2O_4$ constituting the resistance variable layer became 0.90. The value of X was verified by the combination of RBS (Rutherford backscattering) and fluorescent X-ray analysis. As a result of this verification, the value of X was 0.90.

It was confirmed that the resistance variable element of Example 5 was nonvolatile, i.e., the resistance value of the resistance variable element of Example 5 did not change even if the power supply was turned off.

By carrying out the forming (voltage application of +5 V for 100 ns) with respect to the resistance variable element of Example 5, the resistance variable element showed the property as the resistance variable element.

Figure 11:
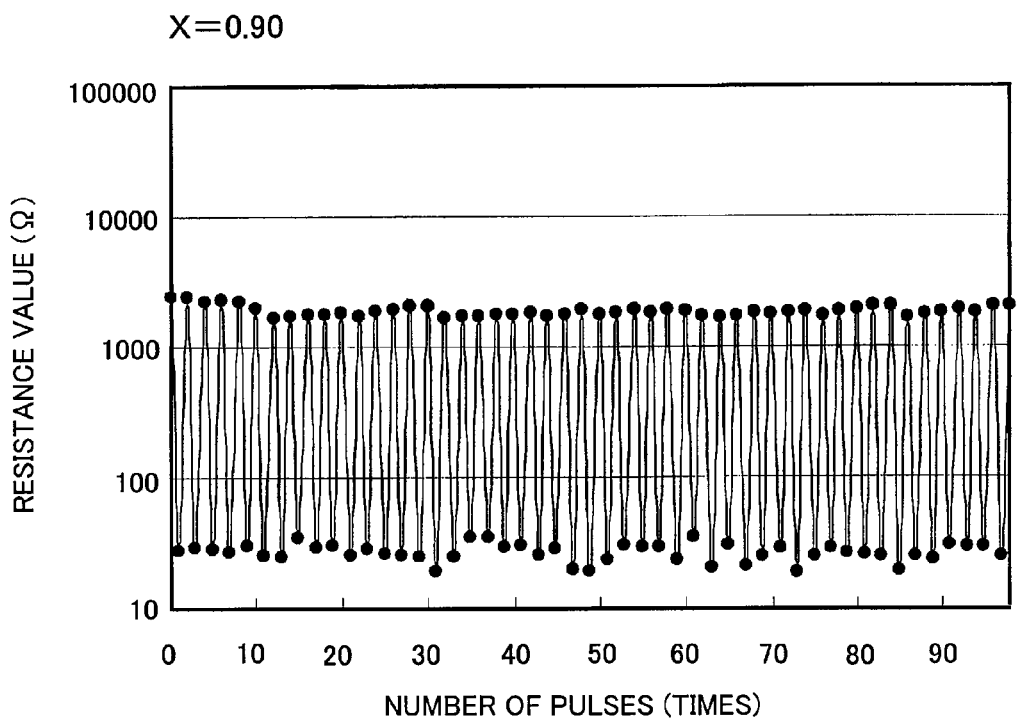
FIG. 11 is a diagram showing changes in resistance value when the voltage pulses are applied to the resistance variable element of Example 4.

FIG. 11 is a diagram showing changes in resistance value when the voltage pulses are applied to the resistance variable element of Example 5. As shown in FIG. 11, after the forming was carried out, the resistance state changed from the high resistance state (about 2,400Ω) to the low resistance state (about 30Ω) by the first pulse application (short pulse application). The resistance state returned from the low resistance state to the high resistance state by the second pulse application (long pulse application). After that, by the application of two types of voltage pulses (the short pulse and the long pulse), the resistance value stably, periodically changed between the low resistance state and the high resistance state.

Even through the short pulse was applied to the resistance variable element of Example 5 when the resistance variable element was in the low resistance state, the resistance value of the resistance variable element did not practically change, and the resistance variable element remained in the low resistance state. Moreover, even though the long pulse was applied to the resistance variable element of Example 5 when the resistance variable element was in the high resistance state, the resistance value of the resistance variable element did not practically change, and the resistance variable element remained in the high resistance state. It was found from the above result that the resistance variable element of Example 5 was overwriteable.

Example 6

In Example 6, the resistance variable element was formed by substantially the same method as Example 1 except that the parameter was different, and the forming was carried out. Using this resistance variable element, the writing and the reading were carried out.

In Example 6, the electrode was formed by sputtering using only the target of $ZnFe_2O_4$ such that the value of X of $(Zn_xFe_{1-x})Fe_2O_4$ constituting the resistance variable layer became 1.0. The value of X was verified by the combination of RBS (Rutherford backscattering) and fluorescent X-ray analysis. As a result of this verification, the value of X was 1.0.

It was confirmed that the resistance variable element of Example 6 was nonvolatile, i.e., the resistance value of the resistance variable element of Example 6 did not change even if the power supply was turned off.

By carrying out the forming (voltage application of +7 V for 100 ns) with respect to the resistance variable element of Example 5, the resistance variable element showed the property as the resistance variable element.

Figure 12:
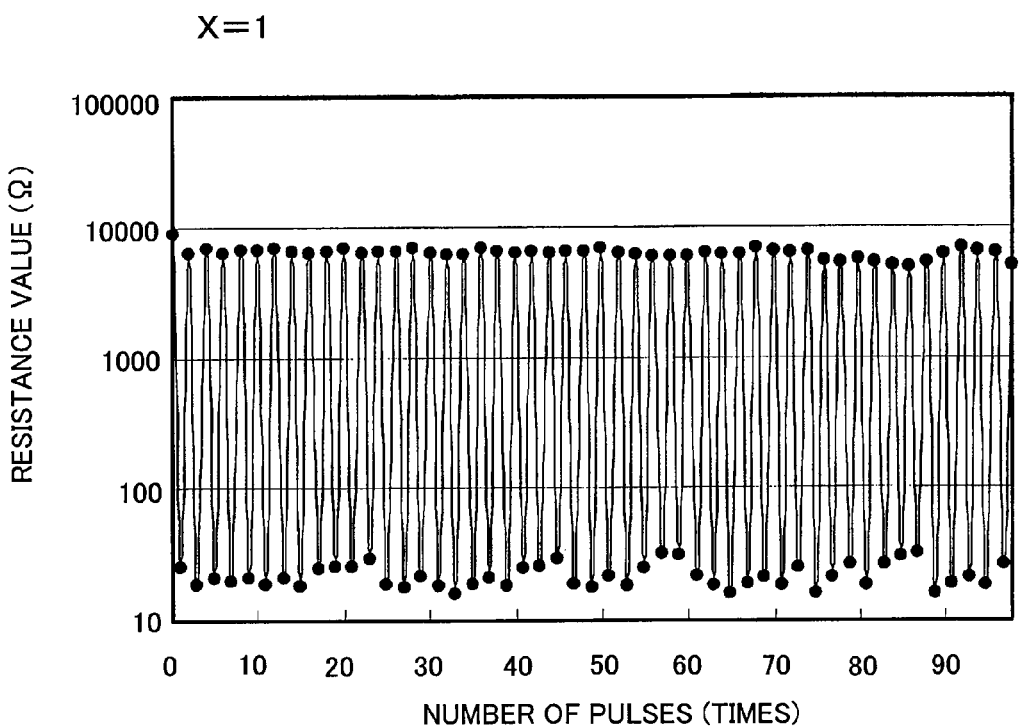
FIG. 12 is a diagram showing changes in resistance value when the voltage pulses are applied to the resistance variable element of Example 5.
Figure 1:
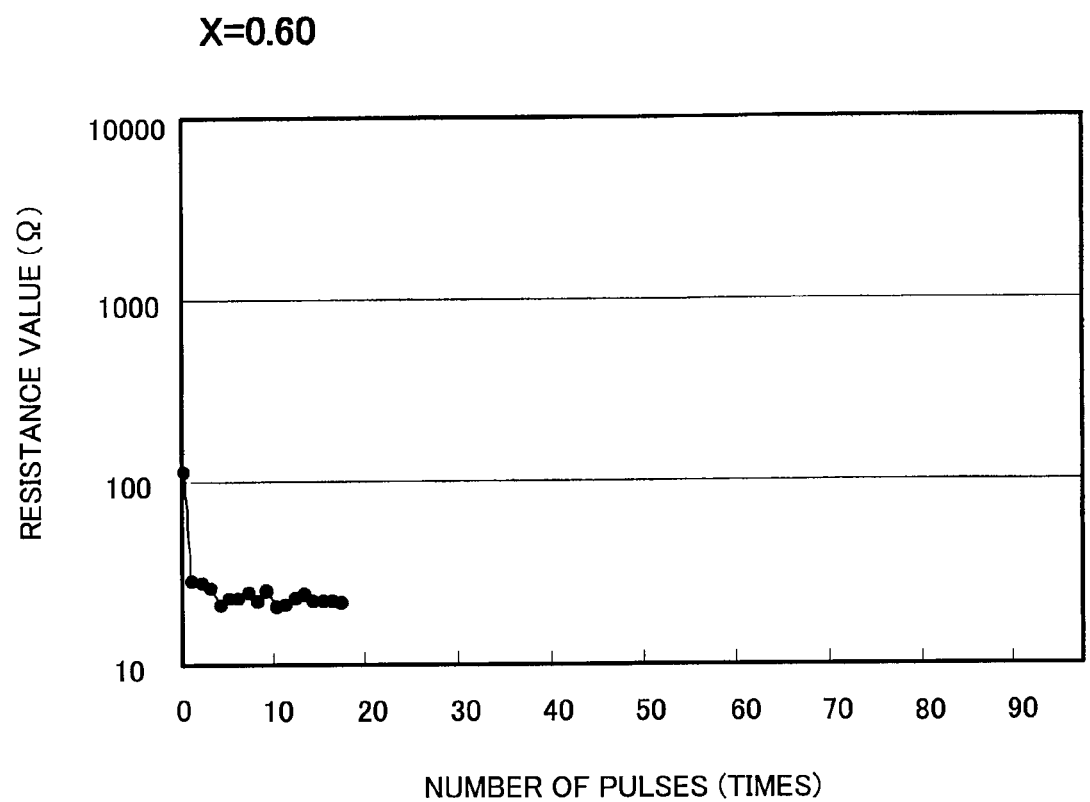

FIG. 12 is a diagram showing changes in resistance value when the voltage pulses are applied to the resistance variable element of Example 6. As shown in FIG. 12, after the forming was carried out, the resistance state changed from the high resistance state (about 6,500Ω) to the low resistance state (about 20Ω) by the first pulse application (short pulse application). The resistance state returned from the low resistance state to the high resistance state by the second pulse application (long pulse application). After that, by the application of two types of voltage pulses (the short pulse and the long pulse), the resistance value stably, periodically changed between the low resistance state and the high resistance state.

Even though the short pulse was applied to the resistance variable element of Example 6 when the resistance variable element was in the low resistance state, the resistance value of the resistance variable element did not practically change, and the resistance variable element remained in the low resistance state. Moreover, even though the long pulse was applied to the resistance variable element of Example 6 when the resistance variable element was in the high resistance state, the resistance value of the resistance variable element did not practically change, and the resistance variable element remained in the high resistance state. It was found from the above result that the resistance variable element of Example 6 was overwriteable.

Comparative Example 1

In Comparative Example 1, the resistance variable element was formed by the same method as Example 1 except that the parameter was different. Using this resistance variable element, the writing and the reading were carried out.

To be specific, in Comparative Example 1, the voltage applied to each target was adjusted such that the value of X of $(Zn_xFe_{1-x})Fe_2O_4$ constituting the resistance variable layer became 0.60. The value of X was verified by the combination of RBS (Rutherford backscattering) and fluorescent X-ray analysis. As a result of this verification, the value of X was 0.60.

FIG. 13 is a diagram showing changes in resistance value when the voltage pulses are applied to the resistance variable element of Comparative Example 1. As shown in FIG. 13, when the value of X was 0.60, the resistance value decreased by the first application of the voltage pulse (+3 V, 100 ns). However, even though the voltage pulse (+2 V, 1 ms) was further applied to the resistance variable element, the resistance value changed little and did not show the memory property. Even though the voltage pulse and the pulse width were changed, the resistance value did not change.

Consideration

It was found from the above Examples that the resistance variable element which can be manufactured at low temperature and operated by the unipolar drive can be obtained by manufacturing the resistance variable layer using the material adjusted such that the value of X of $(Zn_xFe_{1-x})Fe_2O_4$ is not less than 0.65 and not more than 1.

Further, it was found from Examples 1 to 3 that the forming becomes unnecessary by manufacturing the resistance variable layer using the material adjusted such that the value of X of $(Zn_xFe_{1-x})Fe_2O_4$ is not less than 0.65 and not more than 0.85.

Embodiment 2

As an application example of the resistance variable element described in Embodiment 1, the present embodiment will explain the configuration and operation of a resistance variable memory apparatus 100 (cross-point type memory apparatus) incorporating the resistance variable element. The cross-point type memory apparatus is a memory apparatus in which an active layer is provided at an intersection point (three-dimensional cross-point) where a word line and a bit line intersect with each other.

Configuration of Resistance Variable Memory Apparatus 100

Figure 14:
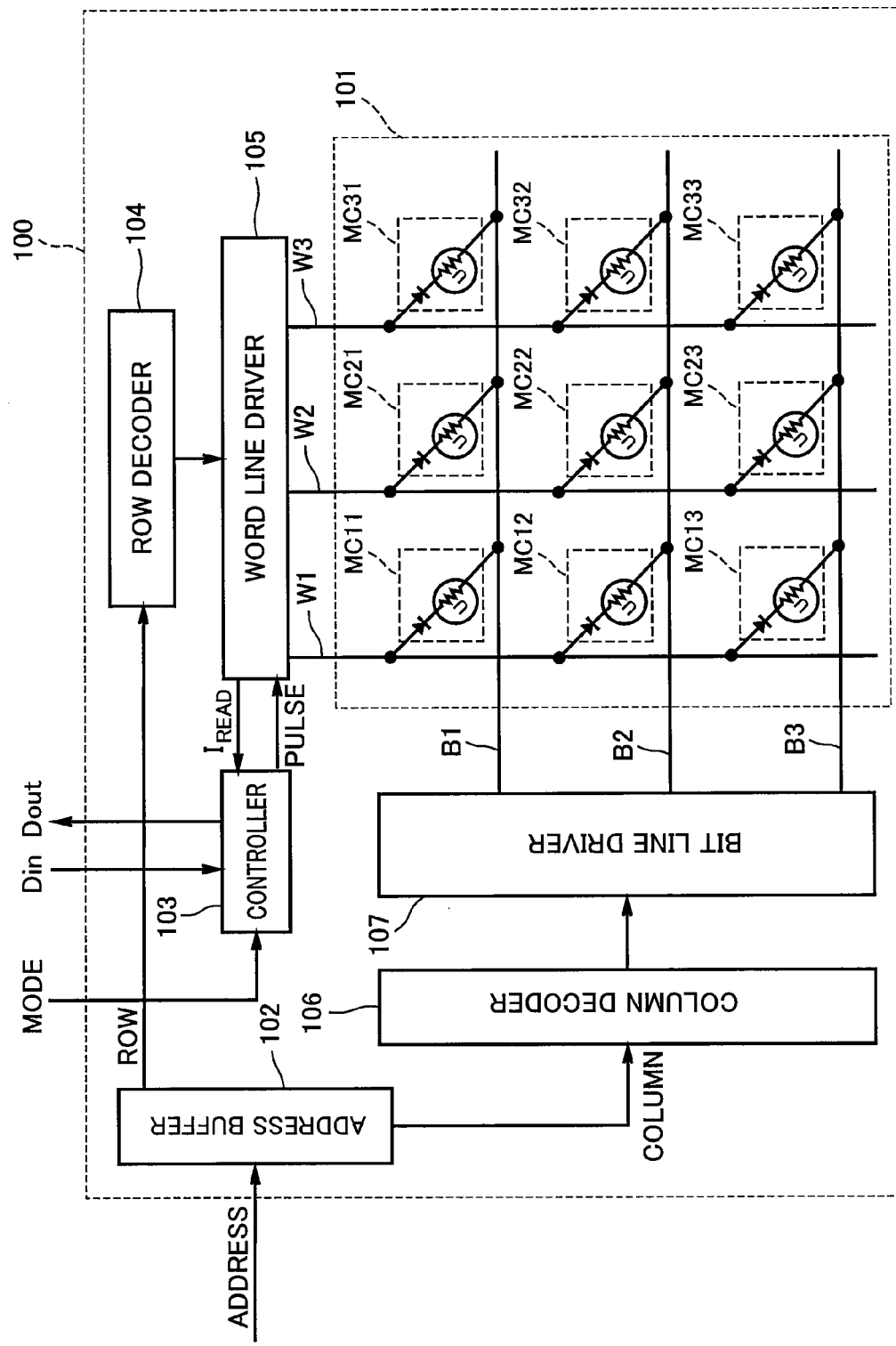
FIG. 14 is a block diagram showing one configuration example of the resistance variable memory apparatus of Embodiment 2 of the present invention.

FIG. 14 is a block diagram showing one configuration example of the resistance variable memory apparatus of Embodiment 2 of the present invention.

The resistance variable memory apparatus 100 includes a memory array 101, an address buffer 102, a controller 103 (voltage pulse applying device), a row decoder 104, a word line driver 105 (word line driving portion), a column decoder 106, and a bit line driver 107 (bit line driving portion).

As shown in FIG. 14, the memory array 101 includes a plurality of word lines W1, W2, W3, and the like (first wires) and a plurality of bit lines B1, B2, B3, and the like (second wires). The word lines W1, W2, W3, and the like are formed on a semiconductor substrate so as to extend in a first direction and be in parallel with one another. The bit lines B1, B2, B3, and the like are formed above the word lines W1, W2, W3, and the like so as to extend in a second direction on a plane parallel to a main surface of the semiconductor substrate, be in parallel with one another, and three-dimensionally cross the word lines W1, W2, W3, and the like.

Moreover, a plurality of memory cells MC11, MC12, MC13, MC21, MC22, MC23, MC31, MC32, MC33, and the like (hereinafter referred to as "memory cells MC11, MC12, and the like") are provided in a matrix so as to correspond to three-dimensional cross-points where the word lines W1, W2, W3, and the like and the bit lines B1, B2, B3, and the like intersect with one another. Each memory cell MC includes a resistance variable element 6 and a rectifying element 7 (diode for example) which are connected to each other in series. The resistance variable elements 6 are connected to the bit lines B1, B2, B3, and the like, and the rectifying elements 7 are connected to the word lines W1, W2, W3, and the like. Each of the resistance variable elements 6 is the resistance variable element of the present invention. For example, the resistance variable element 10 of Embodiment 1 can be used as the resistance variable element 6.

The address buffer 102 receives an address signal ADDRESS from an external circuit (not shown), and outputs a row address signal ROW to the row decoder 104 and a column address signal COLUMN to the column decoder 106 based on the address signal ADDRESS. The address signal ADDRESS is a signal indicating an address of the memory cell selected from the memory cells MC11, MC12, and the like. The row address signal ROW is a signal indicating a row address of the address indicated by the address signal ADDRESS. The column address signal COLUMN is a signal indicating a column address of the address indicated by the address signal ADDRESS.

Based on a mode selecting signal MODE supplied from the external circuit, the controller 103 selects one of a write mode (the write mode for changing to the low resistance state or the write mode for changing to the high resistance state is alternatively selected based on the value of an input data Din) and a readout mode.

In the write mode, the controller 103 outputs the write voltage pulse for changing to the low resistance state or the write voltage pulse for changing to the high resistance state to the word line driver 105 based on the input data Din supplied from the external circuit.

In the readout mode, the controller 103 outputs a readout (reproduction) voltage application to the word line driver 105. Further, in the readout mode, the controller 103 receives a signal $I_{READ}$ output from the word line driver 105 and outputs to the external circuit an output data Dout indicating a bit value corresponding to the signal $I_{READ}$. The signal $I_{READ}$ is a signal indicating the current value of the current flowing through the word lines W1, W2, W3, and the like in the readout mode.

The row decoder 104 receives the row address signal ROW output from the address buffer 102, and selects one of the word lines W1, W2, W3, and the like based on the row address signal ROW.

Based on the output signal from the row decoder 104, the word line driver 105 applies the voltage input from the controller 103, to the word line selected by the row decoder 104.

The column decoder 106 receives the column address signal COLUMN from the address buffer 102, and selects one of the bit lines B1, B2, B3, and the like based on the column address signal COLUMN.

Based on the output signal from the column decoder 106, the bit line driver 107 causes the bit line selected by the column decoder 106 to be in a ground state.

In the present embodiment, the address buffer 102, the row decoder 104, and the word line driver 105 constitute a first wire selector. Moreover, the address buffer 102, the column decoder 106, and the bit line driver 107 constitute a second wire selector. Moreover, the address buffer 102, the row decoder 104, the word line driver 105, the column decoder 106, and the bit line driver 107 constitute a memory cell selector.

Operations

Next, examples of the write operation for changing to the high resistance state, the write operation for changing to the low resistance state, and the readout (reproduction) operation of the cross-point type memory of the present embodiment will be explained in reference to the drawings. As the method for selecting the bit line or the word line, the method for applying the voltage pulse, and the like, known methods can be used, so that detailed explanations thereof are omitted. The following will explain an example in which the writing and the reading are carried out with respect to the memory cell MC22.

Write Operation for Changing to Low Resistance State

When writing one-bit data indicating "1" to the memory cell MC22 (When storing one-bit data indicating "1" in the memory cell MC22), the bit line driver 107 causes the bit line B2 to be connected to ground, and the word line driver 105 causes the word line W2 to be electrically connected to the controller 103. Then, the controller 103 applies the write short pulse to the word line W2. The voltage value of the short pulse is set to +3 V for example, and the pulse width thereof is set to 100 ns for example.

By the above operation, the short pulse is applied to the resistance variable element 6 of the memory cell MC22, so that the resistance variable element 6 of the memory cell MC22 becomes the low resistance state corresponding to "1".

Write Operation for Changing to High Resistance State

When writing one-bit data indicating "0" to the memory cell MC22 (When storing one-bit data indicating "0" in the memory cell MC22), the bit line driver 107 causes the bit line B2 to be connected to ground, and the word line driver 105 causes the word line W2 to be electrically connected to the controller 103. Then, the controller 103 applies the write long pulse to the word line W2. The voltage value of the long pulse is set to +2 V for example, and the pulse width thereof is set to 1 ms for example.

By the above operation, the long pulse is applied to the resistance variable element 6 of the memory cell MC22, so that the resistance variable element 6 of the memory cell MC22 becomes the high resistance state corresponding to "0".

Readout Operation

When reading out the data written in the memory cell MC22, the bit line driver 107 causes the bit line B2 to be connected to ground, and the word line driver 105 causes the word line W2 to be electrically connected to the controller 103. Then, the controller 103 applies the readout voltage to the word line W2. The voltage value of the readout voltage is set to "+0.5 V" for example. When the readout voltage is applied to the memory cell MC22, the current of the current value corresponding to the resistance value of the resistance variable element 6 of the memory cell MC22 flows between the bit line B2 and the word line W2.

The controller 103 detects through the word line driver 105 the magnitude of the current flowing between the bit line B2 and the word line W2. Based on the current and the readout voltage, the controller 103 detects the resistance state of the memory cell MC22.

When the resistance value of the resistance variable element 6 of the memory cell MC22 is "Rb" that is the high resistance, the memory cell MC22 is determined as the state of "0". When the resistance value of the resistance variable element 6 of the memory cell MC22 is "Ra" that is the low resistance, the resistance variable element 6 is determined as the state of "1".

By the above operation, the data written in the memory cell MC22 is read out.

Modification Example

In the foregoing explanation, a single-layer cross-point type memory apparatus was configured, but a plural-layer cross-point type memory apparatus may be configured by stacking the memory arrays. Moreover, the resistance variable element 6 and the rectifying element 7 may be replaced with each other. To be specific, the word line may be connected to the resistance variable element 6, and the bit line may be connected to the rectifying element 7. The bit line or the word line may also serve as the electrode of the resistance variable element.

The foregoing explanation has been made based on the assumption that the resistance variable element is overwriteable. However, if the overwriting tends to cause abnormal behavior, the resistance state of the resistance variable element may be read out before the writing, and whether the writing pulse is applied or not may be selected. Or, the resistance states of the resistance variable elements that are write targets may be set to the initial states, and the writing may be then carried out to the resistance variable element whose resistance value needs to be changed.

Effects

As is clear from the above explanation, the resistance variable memory apparatus 100 of the present embodiment includes in the memory cell the resistance variable element which can be manufactured at low temperature and operated by the unipolar drive, and is configured as the cross-point type memory apparatus. Therefore, it is possible to realize the high integration and the increase in capacity by the simple configuration. Especially, in the case of configuring the resistance variable memory apparatus 100 of the present embodiment as the plural-layer cross-point type memory apparatus, the increase in capacity of the memory can be easily realized.

In the resistance variable memory apparatus 100 of the present embodiment, the diode is provided in series with the resistance variable element. Therefore, the current leakage to adjacent resistance variable elements (memory cells) and the cross talk do not occur in the process of the writing or the reading.

From the foregoing explanation, many modifications and other embodiments of the present invention are obvious to one skilled in the art. Therefore, the foregoing explanation should be interpreted only as an example, and is provided for the purpose of teaching the best mode for carrying out the present invention to one skilled in the art. The structural and/or functional details may be substantially modified within the spirit of the present invention.

INDUSTRIAL APPLICABILITY

The resistance variable element and the resistance variable memory apparatus of the present invention are useful as a new resistance variable element which can be manufactured at low temperature and has a feature that all the write voltage pulses have the same polarity as one another (i.e., the resistance variable element can be operated by the unipolar drive), and a resistance variable memory apparatus using the new resistance variable element.

The invention claimed is:

1. A resistance variable element comprising:
   a first electrode;
   a second electrode; and
   a resistance variable layer provided between the first electrode and the second electrode to be electrically connected to the first electrode and the second electrode, wherein:
   the resistance variable layer contains a material having a spinel structure represented by a chemical formula of $(Zn_xFe_{1-x})Fe_2O_4$, where $0 \leq x \leq 1$; and
   the resistance variable element has a feature that an electrical resistance between the first electrode and the second electrode decreases by applying a first voltage pulse having a first voltage to between the first electrode and the second electrode, and the electrical resistance between the first electrode and the second electrode increases by applying a second voltage pulse having a second voltage whose polarity is the same as the first voltage to between the first electrode and the second electrode.

2. The resistance variable element according to claim 1 which is for use in unipolar drive and stores information by causing the electrical resistance between the first electrode and the second electrode to decrease by applying the first voltage pulse having the first voltage to between the first electrode and the second electrode, and by causing the electrical resistance between the first electrode and the second electrode to increase by applying the second voltage pulse having the second voltage whose polarity is the same as the first voltage to between the first electrode and the second electrode.

3. The resistance variable element according to claim 1, wherein a pulse width of the first voltage pulse is a first pulse width, a pulse width of the second voltage pulse is a second pulse width, and the second pulse width is longer than the first pulse width.

4. The resistance variable element according to claim 1, wherein the X is not less than 0.65 and not more than 1.

5. The resistance variable element according to claim 1, wherein the X is not less than 0.65 and not more than 0.85.

6. The resistance variable element according to claim 1, further comprising a rectifying element electrically connected to the first electrode or the second electrode.

7. The resistance variable element according to claim 6, wherein the rectifying element is a diode.

8. The resistance variable element according to claim 1, wherein at least one of the first electrode and the second electrode is an electrode made of one or a plurality of materials selected from the group consisting of Ag, Au, Pt, Ru, $RuO_2$, Ir, $IrO_2$, TiO, TiN, TiAlN, Ta, and TaN.

9. The resistance variable element according to claim 1, wherein the resistance variable layer has a thickness of 200 nm or less.

10. A resistance variable memory apparatus comprising:
    the resistance variable element according to claim 1; and
    a voltage pulse applying device, wherein
    the voltage pulse applying device is configured to apply a predetermined voltage pulse to between the first electrode and the second electrode to cause the resistance variable element to store data corresponding to the resistance value of the resistance variable element which value changes by the predetermined voltage pulse.

11. The resistance variable memory apparatus according to claim 10, wherein the voltage pulse applying device is configured to apply the first voltage pulse having the first voltage to between the first electrode and the second electrode to cause the resistance variable element to change to a low resistance state and apply the second voltage pulse having the second voltage whose polarity is the same as the first voltage to between the first electrode and the second electrode to cause the resistance variable element to change to a high resistance state, to cause the resistance variable element to store data corresponding to the resistance state of the resistance variable element.

12. A resistance variable memory apparatus comprising:
a cross-point type memory array in which each of memory cells includes the resistance variable element according to claim 1;
a memory cell selector configured to select a specific memory cell of the memory array; and
a voltage pulse applying device, wherein
the voltage pulse applying device is configured to apply a predetermined voltage pulse to between the first electrode and the second electrode of the memory cell selected by the memory cell selector to cause the resistance variable element to store data corresponding to the resistance value of the resistance variable element which value changes by the predetermined voltage pulse.

13. A resistance variable memory apparatus comprising:
a memory array including a semiconductor substrate, a plurality of first wires formed on the semiconductor substrate so as to be in parallel with one another, a plurality of second wires formed above the plurality of first wires so as to be in parallel with one another on a plane parallel to a main surface of the semiconductor substrate and three-dimensionally cross the plurality of first wires, and memory cells in each of which the resistance variable element according to claim 1 and a rectifying element are connected to each other in series, wherein the memory cell is provided to correspond to each of three-dimensional cross-points where the plurality of first wires and the plurality of second wires cross one another and to electrically connect to the first wire and the second wire;
a first wire selector configured to select a specific first wire;
a second wire selector configured to select a specific first wire; and
a voltage pulse applying device, wherein
the voltage pulse applying device is configured to apply the first voltage pulse having the first voltage to between the first electrode and the second electrode of the memory cell connected to the first wire selected by the first wire selector and the second wire selected by the second wire selector to cause the resistance variable element to change to a low resistance state and apply the second voltage pulse having the second voltage whose polarity is the same as the first voltage to between the first electrode and the second electrode of the memory cell connected to the first wire selected by the first wire selector and the second wire selected by the second wire selector to cause the resistance variable element to change to a high resistance state, to cause the resistance variable element to store data corresponding to the resistance state of the resistance variable element.

14. A method for recording data in a resistance variable element, comprising the steps of:
applying two types of voltage pulses having the same polarity as each other to between the first electrode and the second electrode of the resistance variable element according to claim 1 to change a resistance state of the resistance variable element; and
recording data in the resistance variable element based on changes in the resistance state.

* * * * *